(12) United States Patent
Smith et al.

(10) Patent No.: US 12,230,724 B2
(45) Date of Patent: *Feb. 18, 2025

(54) SOLAR CELLS HAVING HYBRID ARCHITECTURES INCLUDING DIFFERENTIATED P-TYPE AND N-TYPE REGIONS WITH OFFSET CONTACTS

(71) Applicant: Maxeon Solar Pte. Ltd., Singapore (SG)

(72) Inventors: David D. Smith, Campbell, CA (US); Jeffrey El Cotter, San Jose, CA (US); David Aaron Randolph Barkhouse, Oakland, CA (US); Taeseok Kim, Pleasanton, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/217,397

(22) Filed: Jun. 30, 2023

(65) Prior Publication Data

US 2023/0361232 A1 Nov. 9, 2023

Related U.S. Application Data

(62) Division of application No. 16/832,762, filed on Mar. 27, 2020, now Pat. No. 11,735,678.

(Continued)

(51) Int. Cl.
*H01L 31/18* (2006.01)
*H01L 31/0224* (2006.01)
(Continued)

(52) U.S. Cl.
CPC .. *H01L 31/0481* (2013.01); *H01L 31/022441* (2013.01); *H01L 31/077* (2013.01); *H01L 31/186* (2013.01)

(58) Field of Classification Search
CPC . H01L 31/186; H01L 31/0481; H01L 31/077; H01L 31/022433; H01L 31/022441; H01L 31/0747
See application file for complete search history.

(56) References Cited

U.S. PATENT DOCUMENTS 11,735,678 B2 * 8/2023 Smith ............ H01L 31/022441
136/243
2007/0256728 A1 11/2007 Cousins
(Continued)

FOREIGN PATENT DOCUMENTS

CN 101438420 A 5/2009
CN 103943701 7/2014
(Continued)

OTHER PUBLICATIONS

International Search Report and Written Opinion from PCT/US2020/025483 mailed Jul. 17, 2020, 10 pgs.
(Continued)

*Primary Examiner* — Andrew J Golden
(74) *Attorney, Agent, or Firm* — Schwabe, Williamson & Wyatt, P.C.

(57) ABSTRACT

A solar cell, and methods of fabricating said solar cell, are disclosed. The solar cell can include a first emitter region over a substrate, the first emitter region having a perimeter around a portion of the substrate. A first conductive contact is electrically coupled to the first emitter region at a location outside of the perimeter of the first emitter region.

7 Claims, 8 Drawing Sheets

Related U.S. Application Data

(60) Provisional application No. 62/826,699, filed on Mar. 29, 2019.

(51) Int. Cl.
*H01L 31/048* (2014.01)
*H01L 31/077* (2012.01)

(56) References Cited

U.S. PATENT DOCUMENTS

| | | | |
|---|---|---|---|
| 2009/0014063 | A1 | 1/2009 | Stangl et al. |
| 2010/0186803 | A1 | 7/2010 | Borden et al. |
| 2010/0186807 | A1 | 7/2010 | Borden |
| 2011/0056545 | A1* | 3/2011 | Ji .................. H01L 31/0747 136/255 |
| 2011/0272012 | A1 | 11/2011 | Heng et al. |
| 2013/0164878 | A1 | 6/2013 | Cousins et al. |
| 2014/0373919 | A1 | 12/2014 | Desrues et al. |
| 2015/0162477 | A1 | 6/2015 | Hirose et al. |
| 2016/0225938 | A1 | 8/2016 | Feldman |
| 2016/0268454 | A1 | 9/2016 | Gwon |
| 2017/0077322 | A1 | 3/2017 | Westerberg et al. |
| 2017/0117433 | A1 | 4/2017 | Stangl et al. |
| 2017/0288074 | A1 | 10/2017 | Smith et al. |

FOREIGN PATENT DOCUMENTS

| | | |
|---|---|---|
| CN | 106463562 A | 2/2017 |
| JP | 2001119053 | 4/2001 |
| KR | 20120012327 | 2/2012 |
| WO | WO2009094575 A2 | 7/2009 |
| WO | WO 2009157052 | 12/2009 |

OTHER PUBLICATIONS

International Preliminary Report on Patentability from PCT/US2020/025483 mailed Oct. 14, 2021, 7 pgs.
First Action Interview Pre-Interview Communication from U.S. Appl. No. 16/832,762 dated Feb. 9, 2022, 9 pgs.
First Action Interview Office Action from U.S. Appl. No. 16/832,762 dated May 13, 2022, 4 pgs.
Office Action from German Patent Application No 112020001695 dated Jul. 11, 2022, 7 pgs.
Final Office Action from U.S. Appl. No. 16/832,762 dated Aug. 25, 2022, 15 pgs.
Office Action from U.S. Appl. No. 16/832,762 dated Dec. 16, 2022, 18 pgs.
Notification of the First Office Action from Chinese Patent Application No. 202080016423.6 dated Nov. 29, 2023, 30 pgs.
Second Office Action from Chinese Patent Application No. 202080016423.6 dated Jun. 14, 2024, 10 pgs.

* cited by examiner

SOLAR CELLS HAVING HYBRID ARCHITECTURES INCLUDING DIFFERENTIATED P-TYPE AND N-TYPE REGIONS WITH OFFSET CONTACTS

CROSS-REFERENCE TO RELATED APPLICATIONS

This application is a Divisional of U.S. patent application Ser. No. 16/832,762, filed on Mar. 27, 2020, which claims the benefit of U.S. Provisional Application No. 62/826,699, filed on Mar. 29, 2019, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

DETAILED DESCRIPTION

Figure 1:
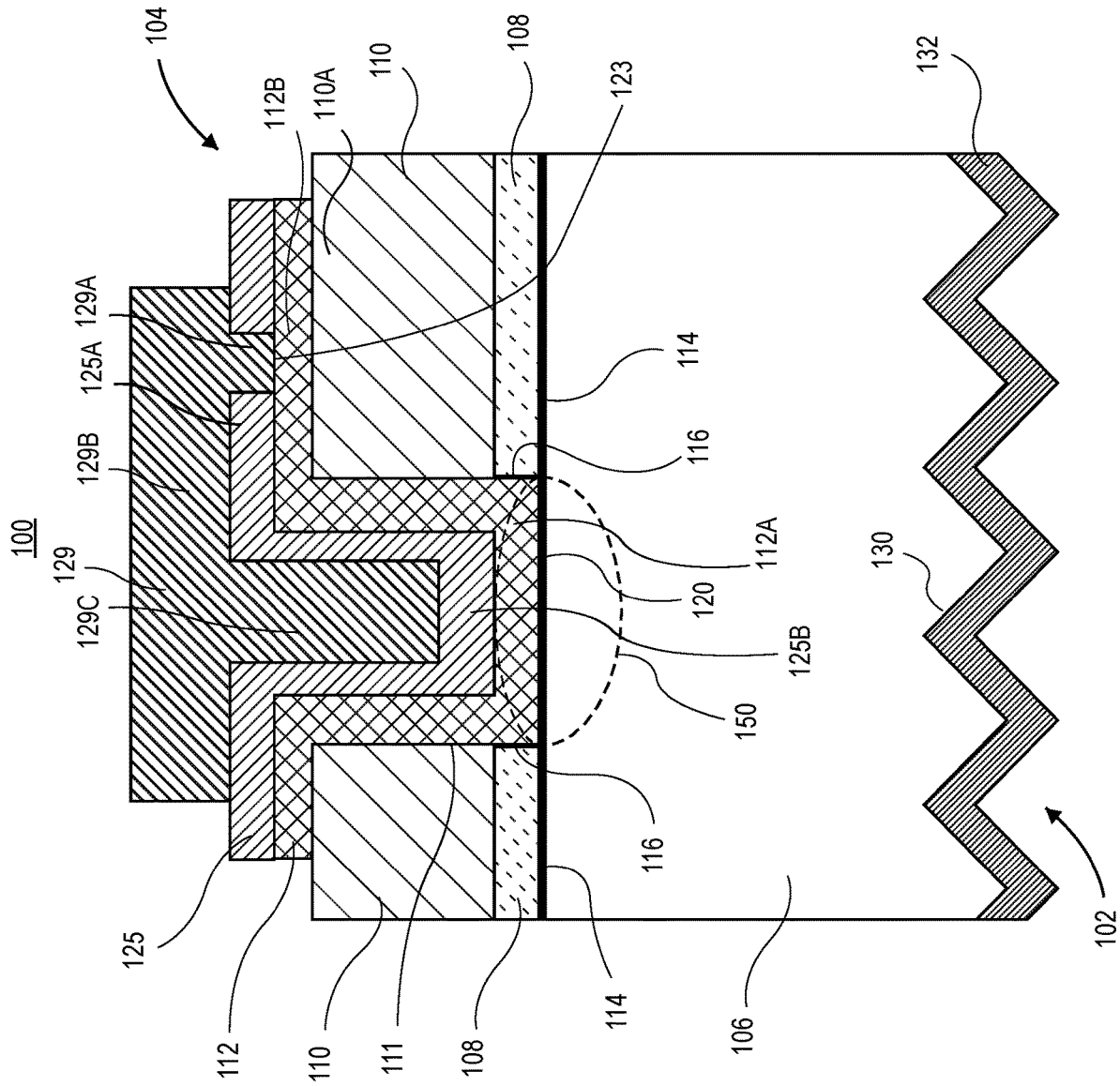
FIG. 1 illustrates a cross-sectional view of a portion of a solar cell, according to some embodiments.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

This specification includes References to "one embodiment" or "an embodiment." do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising." is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not to invoke 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" semiconductor layer does not necessarily imply that this semiconductor layer is the first semiconductor layer in a sequence; instead the term "first" is used to differentiate this semiconductor layer from another semiconductor layer (e.g., a "second" semiconductor layer). As used herein, a semiconductor layer can be a polycrystalline silicon layer, e.g., a polycrystalline silicon layer doped with a P-type or an N-type type dopant. In one example, a first semiconductor layer can be a first polycrystalline silicon layer, where multiple polycrystalline silicon layers can be formed (e.g., a second polycrystalline silicon layer can be formed).

"Based On." As used herein, this term is used to describe one or more factors that affect a determination. This term does not foreclose additional factors that may affect a determination. That is, a determination can be solely based on those factors or based, at least in part, on those factors. Consider the phrase "determine A based on B." While B can be a factor that affects the determination of A, such a phrase does not foreclose the determination of A from also being based on C. In other instances, A can be determined based solely on B.

"Coupled" refers to elements, features, structures or nodes, unless expressly stated otherwise, that are or can be directly or indirectly joined or in communication with another element/node/feature, and not necessarily directly mechanically joined together.

"Inhibit"—describes a reducing, lessening, minimizing or effectively or actually eliminating something, such as completely preventing a result, outcome or future state completely.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials. In an embodiment, multiple dielectric layers can be formed.

About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

Methods of fabricating solar cell emitter regions and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure can be practiced without these specific details. In other instances, well-known fabrication techniques, such as lithography and patterning techniques, are not described in detail in order to not unnecessarily obscure embodiments of the present disclosure. Furthermore, it is to be appreciated that the various embodiments shown in the figures are illustrative representations and are not necessarily drawn to scale.

To provide context, in a hybrid architecture there are two semiconductor layers (such as polysilicon layers) deposited separately. An overlap between the semiconductor layers is separated by a dielectric layer or structure. Contacts can be largely co-incident with the emitters on the wafer. By contrast, embodiments described herein can be implemented to enable the offset of contacts from emitter regions on the wafer.

In accordance with one or more embodiments described herein, an offset contact structure is implemented to decouple semiconductor layer contact with a metal and contact with the substrate or wafer. If contacts are fabricated by laser ablation, laser damage can be reduced or eliminated on one emitter type since a dielectric and lower level poly layer can block transmission of damage to the substrate. By contrast, in cases where laser scribing overlaps or at least partially overlaps with an underlying emitter region, damage to the emitter region can occur. Another potential benefit is the elimination of aluminum spiking risk for the hybrid emitter type. For example, a spike can be performed to make contact without causing shunting. Another potential benefit is that the butting junction area can be made independent of the emitter area. If the emitter and contact are largely co-incident then it can be difficult to shrink the emitter to a dot-like structure and maintain alignment tolerance. If no alignment tolerance is needed, then the emitter can have a variety of shapes, such as lines to minimize butting junction area, or many small dots to maximize butting junction area.

As an exemplary structure having an offset contact, FIG. 1 illustrates a cross-sectional view of a portion of a solar cell 100, according to some embodiments. In an embodiment, the solar cell 100 can include a substrate 106 having a front side 102 and a back side 104, the front side 102 opposite the back side 104. In some embodiments, the front side 102 can be referred to as a front surface and the back side 104 can be referred to as a back surface. In an embodiment, the front side can have a texturized surface. A texturized surface 130 can be one which has a regular or an irregular shaped surface for scattering incoming light, decreasing the amount of light reflected off the light-receiving and/or exposed surfaces of the solar cell 100.

Referring again to FIG. 1, in an embodiment, the solar cell 100 can include a first dielectric layer 120 disposed on the back side 104 of the substrate 106. In some embodiments, the first dielectric layer 120 can be referred to as a first thin dielectric layer. In an example, the first dielectric layer 120 can be a thin oxide layer such as a tunnel dielectric layer (e.g., tunnel oxide, silicon oxynitride, silicon oxide). In an embodiment, the first dielectric layer 120 can have a thickness of approximately 2 nanometers or less.

Referring still again to FIG. 1, in an embodiment, the solar cell 100 can include a first semiconductor layer 112 disposed over the back side of the solar cell 100. In an embodiment, the first semiconductor layer 112 can be disposed on the first dielectric layer 120. In an embodiment, the first semiconductor layer 112 can be a first polycrystalline silicon layer. In an embodiment, the first semiconductor layer 112 can include a first conductivity type. In an example, first semiconductor layer 112 can be a first polycrystalline silicon layer of a first conductivity type. In a specific embodiment, the first conductivity type is N-type (e.g., formed using phosphorus or arsenic impurity atoms). In some embodiments, the first semiconductor layer is a pre-doped polycrystalline silicon layer. In one such embodiment, the first semiconductor layer is formed having a specific conductivity type (e.g., n-type or p-type).

Referring again to FIG. 1, in one embodiment, the solar cell 100 can include a second dielectric layer 114 disposed on the back side 104 of the substrate 106. In some embodiments, the second dielectric layer 114 can be referred to as a second thin dielectric layer. In an example, the second dielectric layer 114 can be a thin oxide layer such as a tunnel dielectric layer (e.g., tunnel oxide, silicon oxynitride, silicon oxide). In an embodiment, the second dielectric layer 114 can have a thickness of approximately 2 nanometers or less.

Referring again to FIG. 1, in an embodiment, the solar cell 100 can include a second semiconductor layer 108 disposed on the second dielectric layer 114. In one embodiment, the second semiconductor layer 108 can be a second polycrystalline silicon layer. In an embodiment, the second semiconductor layer can include a second conductivity type. In an example, second semiconductor layer 108 can be a second polycrystalline silicon layer of a second conductivity type. In a specific embodiment, the second conductivity type is P-type (e.g., formed using boron impurity atoms). In some embodiments, the second semiconductor layer is a pre-doped polycrystalline silicon layer. In one such embodiment, the second semiconductor layer is formed having a specific conductivity type (e.g., n-type or p-type). In an embodiment, the solar cell 100 can further include a first insulator layer 110 disposed on the second semiconductor layer 108. In one example, the first insulator layer 110 can be or include silicon dioxide.

Referring again to FIG. 1, in an embodiment, a third dielectric layer 116 is between the first semiconductor layer 112 and the second semiconductor layer 108. In some embodiments, the third dielectric layer 116 can be referred to as a third thin dielectric layer. In an example, the third dielectric layer 116 can be a thin oxide layer such as a tunnel dielectric layer (e.g., tunnel oxide, silicon oxynitride, silicon oxide). In an embodiment, the third dielectric layer 116 can have a thickness of approximately 2 nanometers or less. In some embodiments, the first, second and third dielectric layer 120, 114, 116 can form a continuous dielectric layer. In an example, the continuous dielectric layer can include the first, second and third dielectric layers 120, 114, 11 and not include any gaps or discontinuities. In some embodiments, any combination of continuous dielectric layers can be formed. For example, the first and second dielectric layers can instead form a continuous dielectric layer. In one example, the first and third dielectric layer and/or the second and third dielectric layers can form continuous dielectric layers.

Referring again to FIG. 1, in an embodiment, a second insulator layer 125 can be disposed on the first semiconductor layer 112. In an embodiment, the second insulator layer 125 can be a dopant layer. In one embodiment, the dopant layer can have a first conductivity type. In an embodiment, the dopant layer is of the same conductivity type as the first semiconductor layer 112. In an example, the dopant layer is N-type (e.g., formed using phosphorus atoms or arsenic impurity atoms). In another example, the dopant layer is P-type (e.g., formed using boron impurity atoms). In an embodiment, the second insulator layer 125 can be a non-continuous layer (e.g., as shown in FIG. 1). In an example, the second insulator layer 125 can be broken into discreet portions and can still be referred to as a single dielectric layer or dopant layer. In one embodiment, the second insulator layer 125 can include silicon oxide or silicon oxynitride. In an embodiment, the second insulator layer 125 can be a dielectric layer.

Figures 2A, 2B:
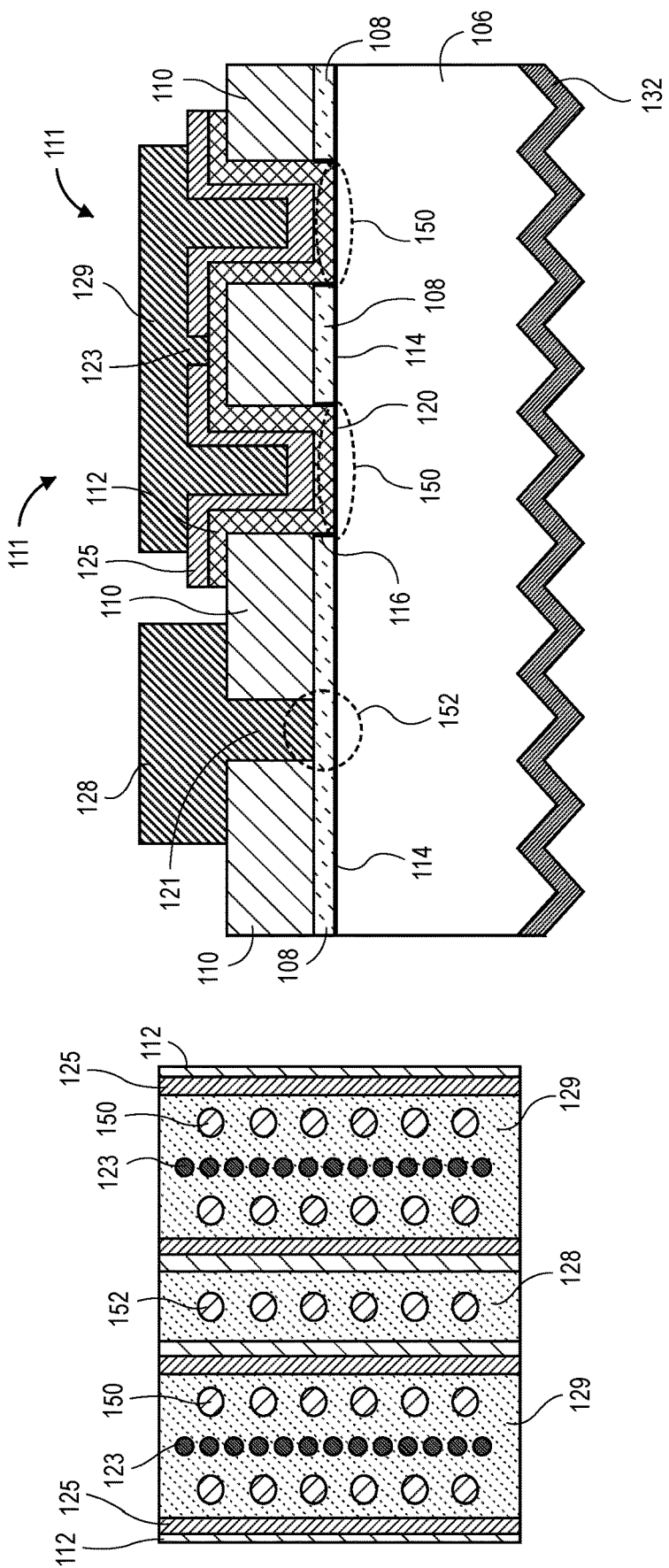
FIGS. 2A and 2B illustrate a plan view and a cross-sectional view, respectively, of a portion of a solar cell, according to some embodiments.

Referring again to FIG. 1, a first conductive contact 129 can be disposed over the first semiconductor layer 112. In one embodiment, the first conductive contact 129 is disposed in an opening 123 in the second insulator layer 125. In an embodiment, although not depicted in FIG. 1 but is depicted in FIGS. 2, described below, the solar cell 100 can include a second conductive contact (e.g., 128 of FIGS. 2A and 2B, described below) disposed over the second semiconductor layer 108. In an embodiment, the second conductive contact can be disposed in an opening (e.g., 121 of FIGS. 2A and 2B, described below) in the first insulator layer 110.

In one embodiment, the first and second conductive contacts 129, 128 can include a plated metal. In an example, the first and second conductive contacts 129, 128 can include copper, tin, titanium, tungsten, and/or nickel, among other metals. In some embodiments, the first and second conductive contacts 129, 128 can include a deposited metal and/or a metal foil. In an example, the first and second conductive contacts 129, 128 can include aluminum or aluminum foil. In an embodiment, the first and second conductive contacts 129, 128 can include a wire, ribbon or any other applicable type of conductive material. In an example, the first and second conductive contacts 129, 128 can include an aluminum wire, aluminum ribbon, etc.

Referring once again to FIG. 1, in an embodiment, the solar cell 100 further can include a fourth dielectric layer 132 disposed on the front side 102. In an embodiment the fourth dielectric layer 132 can be an anti-reflective coating (ARC) layer. In an example, the fourth dielectric layer 132 can include silicon nitride. In one example, the fourth dielectric layer can include a tunnel dielectric layer (e.g., tunnel oxide, silicon oxynitride, silicon oxide). In an embodiment, a polycrystalline silicon layer can be formed on the fourth thin dielectric layer 132. In an embodiment, a fifth dielectric layer can be disposed on the polycrystalline silicon layer. In an embodiment the fifth dielectric layer can be an anti-reflective coating (ARC) layer. In an example, the fifth dielectric layer can include silicon nitride.

Referring again to FIG. 1, in some embodiments, the second semiconductor layer 108 can be a P-type polycrystalline silicon layer. In one embodiment, the first semiconductor layer 112 can be an N-type polycrystalline silicon layer. In an embodiment, the substrate 106 can be an N-type monocrystalline silicon substrate. In an embodiment, the first dielectric layer 120, the second dielectric layer 114, the third dielectric layer 116, and the second insulator layer 125 can include silicon oxide. In an embodiment, first insulator layer 110 is or includes silicon dioxide. In an embodiment where the second insulator layer 125 can include a dopant layer, the second insulator layer 125 can include phosphorus, arsenic or boron. In one embodiment, the second semiconductor layer 108 can be a N-type polycrystalline silicon layer. In an embodiment, the first semiconductor layer 112 can be an P-type polycrystalline silicon layer. In some embodiments, the substrate 106 can be a P-type monocrystalline silicon substrate.

Referring again to FIG. 1, in an embodiment, the first conductive contact 129 (and/or second referenced conductive contact) can include a deposited metal. In an embodiment, the deposited metal can be an aluminum-based. In one such embodiment, the aluminum-based deposited metal can have a thickness approximately in the range of 0.3 to 20 microns and include aluminum in an amount greater than approximately 97% and silicon in an amount approximately in the range of 0-2%. In an example, the aluminum-based deposited metal can include copper, titanium, titanium tungsten, nickel, and/or aluminum, among other metals. In an embodiment, the aluminum-based deposited metal is formed from a blanket deposition process. In an embodiment, the aluminum-based deposited metal can be a metal seed layer. In some examples, the deposited metal can be a deposited aluminum. In one embodiment, a conductive contact as described herein can include copper, tin, nickel, and/or aluminum, among other metals.

Referring once again to FIG. 1, in some embodiments, a conductive contact as described herein includes a metal foil. In an embodiment, the metal foil is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In another embodiment, the aluminum foil is not anodized.

Referring still again to FIG. 1, in an embodiment, a conductive contact as described herein includes a conductive wire. In an embodiment, the conductive wire can include an electrically conducting material (e.g., a metal such as aluminum, copper or another suitable conductive material, with or without a coating such as tin, silver, nickel or an organic solderability protectant). In an example, the conductive wires can be bonded to the first and/or second semiconductor layers by a thermocompression bonding, ultrasonic bonding, or thermosonic bonding process.

With reference again to FIG. 1, in accordance with an embodiment of the present disclosure, a solar cell 100 includes a first emitter region 150 over a substrate 106. The first emitter region 150 has a perimeter around a portion of the substrate, i.e., where the perimeter surrounds the area of the emitter region 150 over the substrate from a plan view perspective (i.e. viewed from a direction normal to the global surface of the substrate. A first conductive contact 129 is electrically coupled to the first emitter region 150 at a location outside of the perimeter of the first emitter region 150, i.e., at a location that is not over the first emitter region 150 from a plan view perspective. It is to be appreciated that use of the term "offset" refers to a contact opening outside of the perimeter of emitter region 150, and not merely misalignment of a contact opening and an underlying emitter region.

In an embodiment, the solar cell 100 further includes a first semiconductor layer 112 over the substrate 106. In one embodiment, the first emitter region 150 is in a first portion 112A of the first semiconductor layer 112, and the location outside of the perimeter of the first emitter region 150 is on a second portion 112B of the first semiconductor layer 112. In one such embodiment, the first portion 112A of the first semiconductor layer 112 is continuous with the second portion 112B of the first semiconductor layer 112.

In an embodiment, the solar cell 100 further includes a first insulator layer 110 above the substrate 106. The first insulator layer 110 has a first opening 111. The first portion of the first semiconductor layer 112A is in the first opening 111 of the first insulator layer 110. The second portion 112B of the first semiconductor layer 112 is over a portion 110A of the first insulator layer 110.

In an embodiment, the solar cell 100 further includes a second insulator layer 125 over the first semiconductor layer 112. The second insulator layer 125 has an opening 123. In one such embodiment, the location outside of the perimeter of the first emitter region 150 is beneath the opening 123 of the second insulator layer 125, and a first portion 129A of the first conductive contact 129 is in the opening of the second insulator layer 125. In a particular such embodiment, a second portion 129B of the first conductive contact 129 is on a portion 125A of the second insulator layer 125 over the first insulator layer 110. A third portion 129C of the first conductive contact 129 is on a portion 125B of the second insulator 125 layer over the first emitter region 150.

In an embodiment, the solar cell 100 further includes a second semiconductor layer 108 between the first insulator layer 110 and the substrate 106. In one embodiment, the second semiconductor layer 108 has a conductivity type opposite a conductivity type of the first semiconductor layer 112. In one embodiment, the second semiconductor layer 112 is included in a second emitter region of the solar cell (e.g., 152 of FIGS. 2A and 2B, described below). In one embodiment, the first insulator layer 110 has a second opening (e.g., 121 of FIGS. 2A and 2B, described below). A second conductive contact (e.g., 128 of FIGS. 2A and 2B, described below) is electrically coupled to the second semiconductor layer 108 at a location beneath the second opening 121 of the first insulator layer 110.

Turning now to FIGS. 2A and 2B, FIGS. 2A and 2B illustrate a plan view and a cross-sectional view of a portion of a solar cell, respectively, according to some embodiments. It is to be appreciated that the plan view illustrates a larger portion of a solar cell than the cross section view in that both show a single emitter structure including a conductive contact of the type 128, but the cross section view shows only a single emitter structure including a first conductive contact of the type 129 while the plan view shows two emitter structures including a first conductive contact of the type 129.

Referring to FIGS. 2A and 2B, a solar cell 200 includes a first insulator layer 110 above a substrate 106. The first insulator layer 110 has a first opening 111 (in this case, two such openings are depicted in FIGS. 2A and 2B) and a second opening 121. A first semiconductor layer 112 is above the substrate 106. A first portion of the first semiconductor layer 112 is in the first opening 111 of the first insulator layer 110. A second portion of the first semiconductor layer 112 is over a portion of the first insulator layer 110. In one embodiment, the first portion of the first semiconductor layer 112 is continuous with the second portion of the first semiconductor layer 112.

With reference again to FIGS. 2A and 2B, a second semiconductor layer 108 is above the substrate 106. The second semiconductor layer 108 is between the first insulator layer 110 and the substrate 106. The second semiconductor layer 108 has a conductivity type opposite a conductivity type of the first semiconductor layer 112. A second insulator layer 125 is over the first semiconductor layer 112. The second insulator layer 125 has an opening 123 over the second portion of the first semiconductor layer 112. In an embodiment, the first semiconductor layer 112 is included in first emitter region 150 (two of which are depicted for each single emitter structure based on a first conductive contact 129 in FIGS. 2A and 2B), and the second semiconductor layer 108 included in a second emitter region 152, which can be an emitter region of opposite conductivity type as compared to emitter region(s) 150.

With reference again to FIGS. 2A and 2B, a first conductive contact 129 (in this case, two such contacts are shown as bridged between two corresponding emitter regions 150) in the opening 111 of the second insulator layer 125. The first conductive contact 129 is electrically coupled to the second portion of the first semiconductor layer 112 at a location beneath the opening 123 of the second insulator layer 125. In an embodiment, the first conductive contact 129 is further on a portion of the second insulator layer 125 over the first insulator layer 110. In one such embodiment, the first conductive contact 129 is still further on a portion of the second insulator layer 125 over the first portion of the first semiconductor layer 112, i.e., the portion of the first semiconductor layer 112 in opening 111 and included in emitter region 150.

With reference again to FIGS. 2A and 2B, in an embodiment, a portion of the insulator layer 110 can be located beneath the opening 123 and over the substrate 106. In a same embodiment, the portion of the insulator layer 110 can be disposed on the second semiconductor layer 108. In an embodiment, the portion of the first insulator layer 110 can physically and/or electrically separate the first semiconductor layer 112 from the second semiconductor layer 108. In a same embodiment, the portion of the insulator layer 110 can be located between at least two openings 111 of the second insulator layer 125. In an embodiment, the portion of the insulator layer 110 can be surrounded by the first semiconductor layer 112. In an example, the portion of the insulator layer 110 can be surrounded by the first semiconductor layer 112 on three sides, as shown in FIG. 2B.

With reference again to FIGS. 2A and 2B, in an embodiment, a portion of the second semiconductor layer 108 can be located beneath the opening 123 and over the substrate 106. In a same embodiment, a portion of the second semiconductor layer 108 can be located beneath a portion of the insulator layer 110 (e.g., the portion beneath the opening 123) and over the substrate 106. In a same embodiment, the portion of the second semiconductor layer 108 can be located between two between emitter regions 150. In a same embodiment, the portion of the second semiconductor layer 108 can be physically and/or electrically isolated (e.g., disconnected, not in contact with) the first semiconductor layer 112 and/or other portions of the second semiconductor layer 108.

A second conductive contact 128 is in the second opening 121 of the first insulator layer 110. The second conductive contact 128 is electrically coupled to the second semiconductor layer 108 at a location beneath the second opening 121 of the first insulator layer 110. In an embodiment, the second conductive contact 128 can extend over the first insulator layer 110, e.g., the second conductive contact 128 can be in the opening 121 and extend over at least one edge of the first insulator layer 110.

In reference to the plan view 200 of FIG. 2A, it is to be appreciated that the opening 123 and emitter regions 150, 152, are shown for clarity and may not be visible in a similar view in a final product. In an example, the conductive contacts 128 can be disposed over emitter regions 152 and the conductive contacts 129 can be disposed over emitter region 150 and opening 123, thus covering opening 123 and emitter regions 150, 152 from view.

Figure 3:
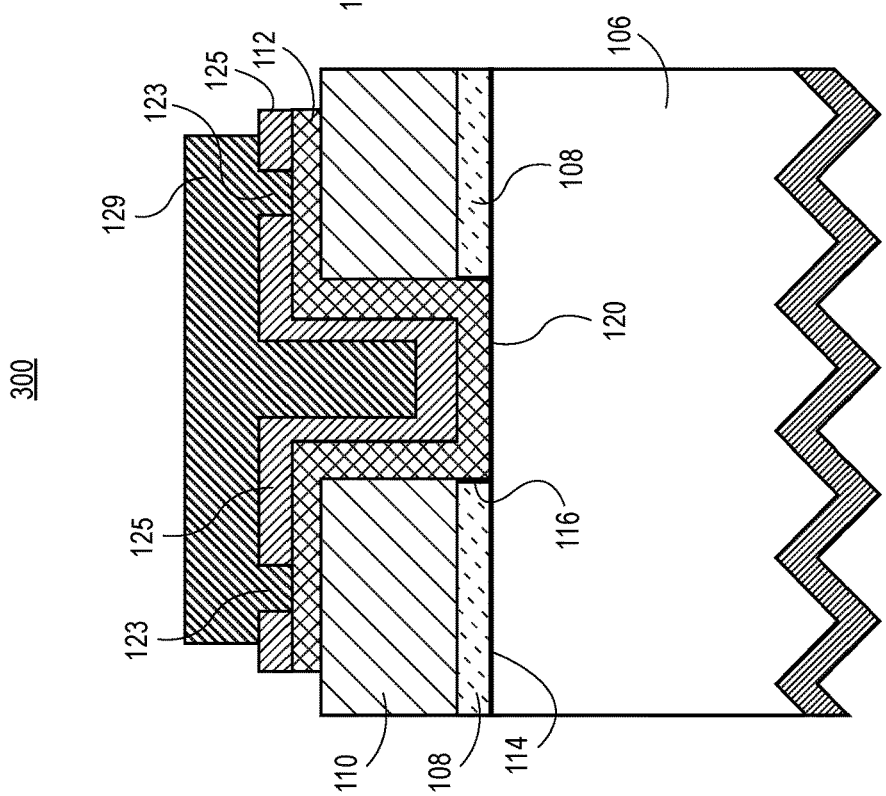
FIG. 3 illustrates a cross-sectional view of a portion of a solar cell, according to some embodiments.

Turning now to FIG. 3, FIG. 3 illustrates a cross-sectional view of a portion of a solar cell 300, according to some embodiments. In the example shown, for each emitter structure including a first semiconductor layer of the type 112 and a first conductive contact of the type 129, two openings 123 can be formed in a second insulator layer 125. In an example, although two openings 123 are shown, 1, 2, 3, 4 or more openings can be formed.

Figure 4:
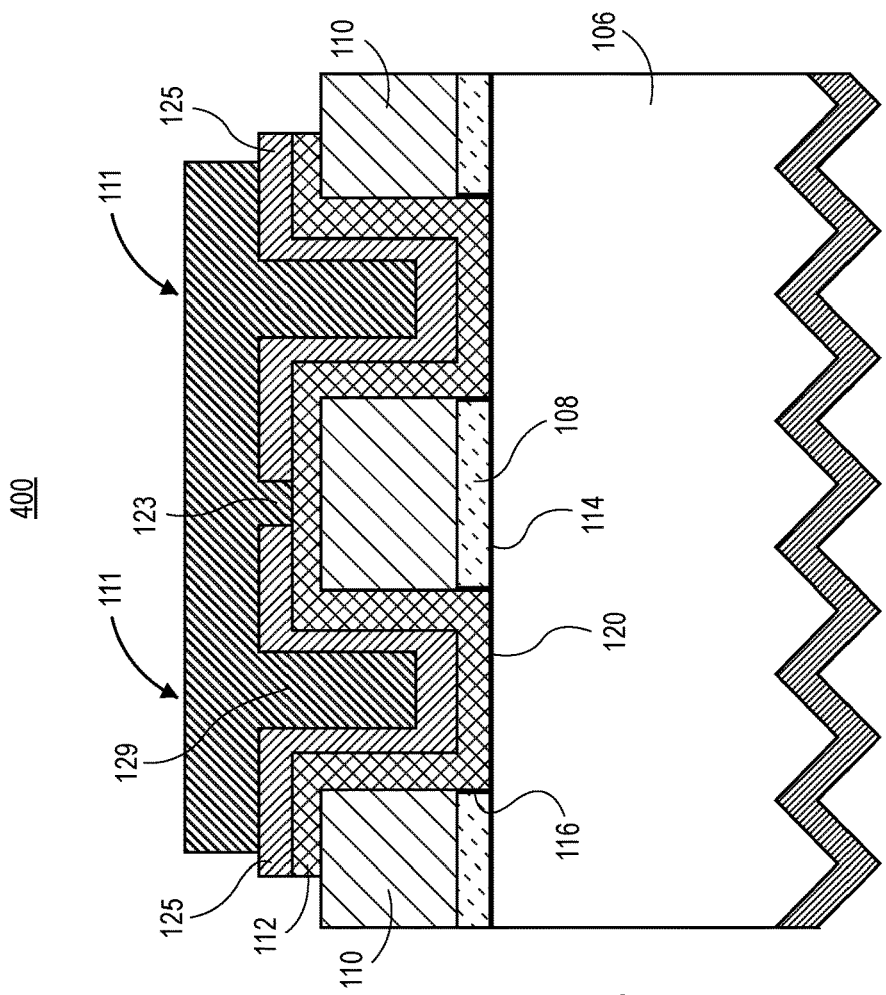
FIG. 4 illustrates a cross-sectional view of a portion of a solar cell, according to some embodiments.

Turning now to FIG. 4, FIG. 4 illustrates a cross-sectional view of a portion of a solar cell 400, according to some embodiments. In the example shown, for each emitter structure including a first semiconductor layer of the type 112 and a first conductive contact of the type 129, two openings 111 can be formed in first insulator layer 110. In an example, although two openings 111 are shown, 1, 2, 3, 4 or more openings can be formed.

Figure 5:
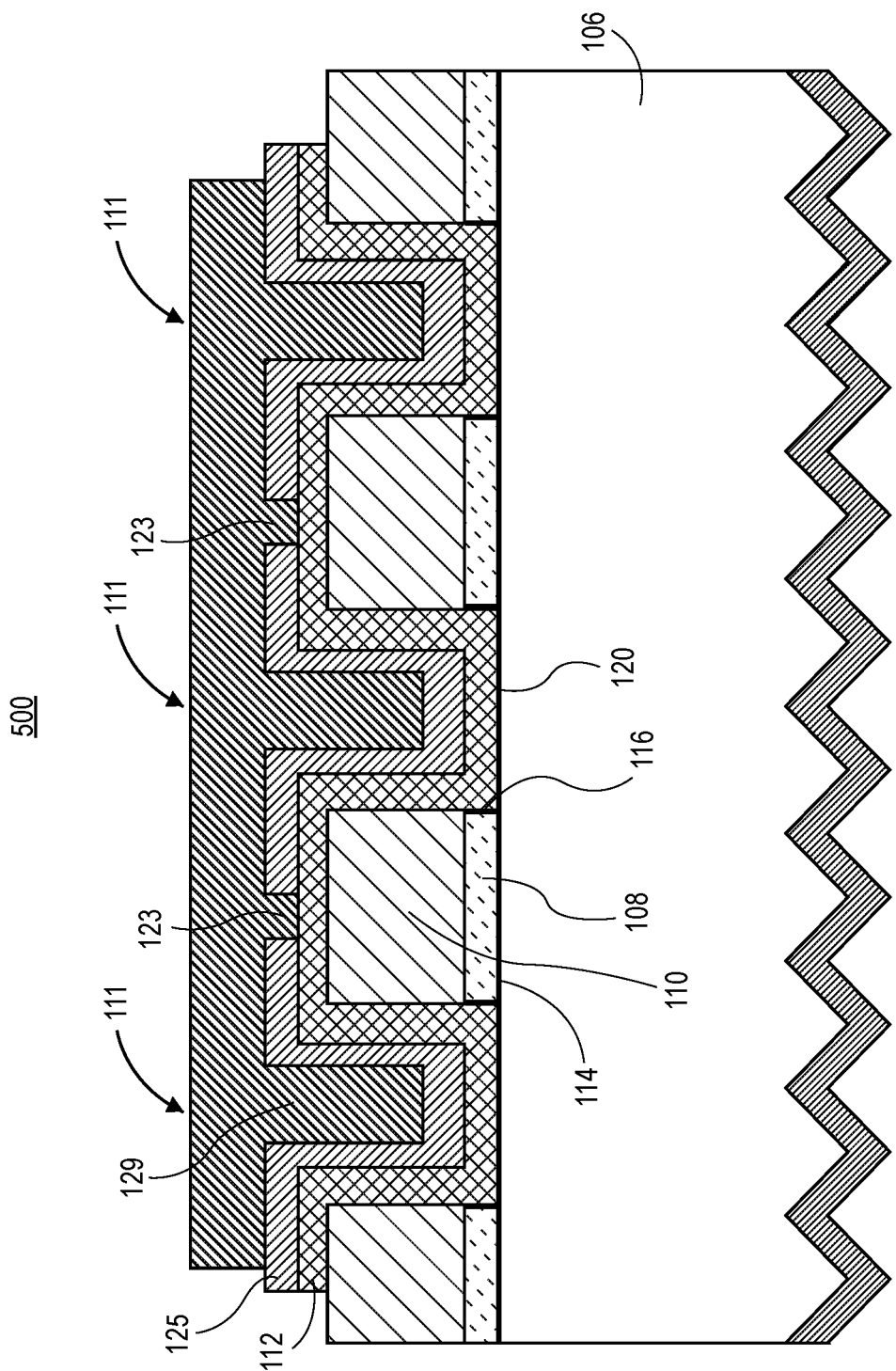
FIG. 5 illustrates a cross-sectional view of a portion of a solar cell, according to some embodiments.

Turning now to FIG. 5, FIG. 5 illustrates a cross-sectional view of a portion of a solar cell 500, according to some embodiments. In the example shown, for each emitter structure including a first semiconductor layer of the type 112 and a first conductive contact of the type 129, three openings 111 are formed in first insulator layer 110, and two openings 123 are formed in second insulator layer 125. In an example, although two openings 123 and three openings for 111 are shown, 1, 2, 3, 4 or more openings can be formed.

Figure 6:
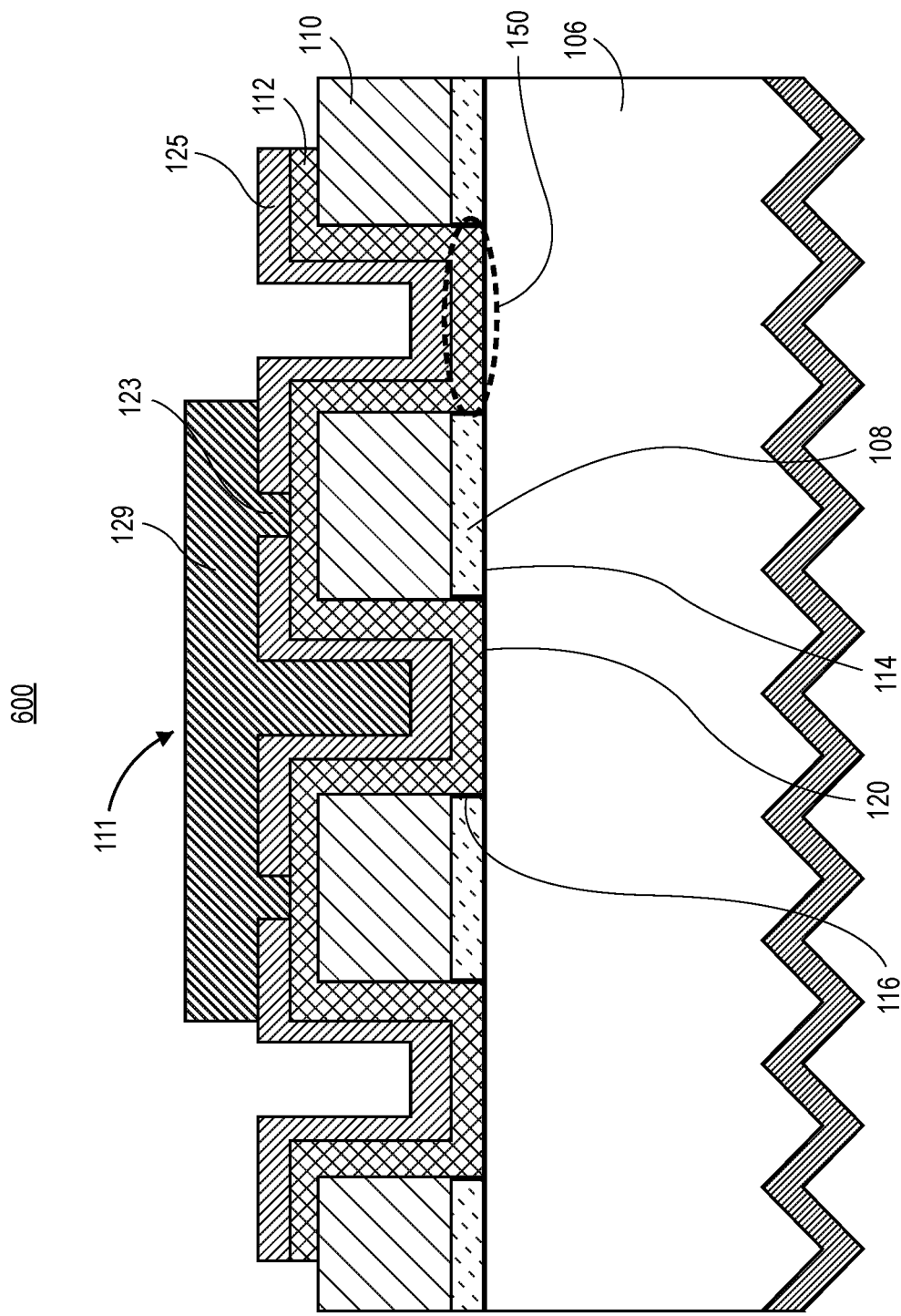
FIG. 6 illustrates a cross-sectional view of a portion of a solar cell, according to some embodiments.

Turning now to FIG. 6, in an example of an open emitter configuration, FIG. 6 illustrates a cross-sectional view of a portion of a solar cell 600, according to some embodiments. In the example shown, for each emitter structure including a first semiconductor layer of the type 112 and a first conductive contact of the type 129, three openings 111 are formed in first insulator layer 110, and two openings 123 are formed in second insulator layer 125. However, the first conductive contact 129 is in the center one of the three openings 111 in the first insulator layer 110. In one embodiment, the first conductive contact 129 is effectively recessed or retracted in from outer portions of the emitter structure. It is to be appreciated that the portions of the second semiconductor layer 112 that extend beyond the first conductive contact 129 should not touch the first semiconductor layer 108 or a conductive contact of the type 128 coupled to the first semiconductor layer 108, e.g., referring to 108, 128 of FIGS. 2A and 2B. In an example, the portion of the solar cell 600 can include portions 125 which are exposed, e.g., not covered and/or underneath the conductive contact 129. In an example, the portions of 125 which are exposed can be located over the openings 111 which are also not covered and/or underneath the conductive contact 129.

It is to be appreciated that in each of the cross-sectional views described above, the conductive contact 129 is shown as being in continuous, intimate contact with the dielectric layer 125 immediately underneath the conductive contact 129. However, it is to be appreciated that in some embodiment the conductive contact 129 only needs to be in physical contact with the second emitter in the openings in the dielectric 123. In all other locations, the conductive contact 129 could be floating. It may even be beneficial in some instances for the conductive contact 129 to not be in intimate contact with the insulator over the first emitter (e.g., to reduce shunting risks).

Figure 7:
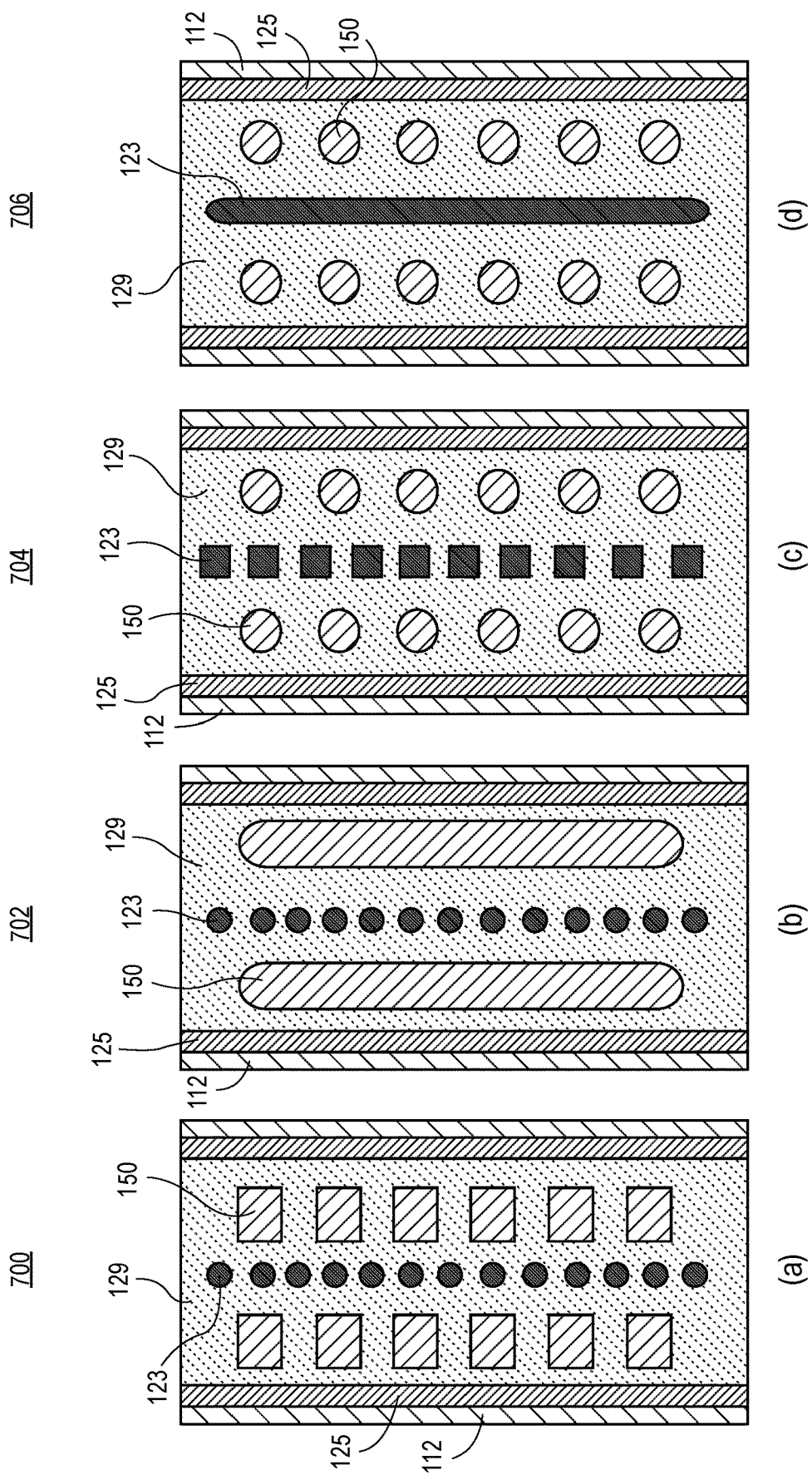
FIG. 7 illustrates exemplary plan views of portions of solar cells, according to some embodiments.

Turning now to FIG. 7, FIG. 7 illustrates exemplary plan views of portions of solar cells, according to some embodiments.

Referring to part (a) of FIG. 7, a solar cell 700 can include any suitable shape for emitter region 150, such as a square shape as is depicted. Referring to part (b) of FIG. 7, a solar cell 702 can include a unified line shape for emitter region 150. Referring to part (c) of FIG. 7, a solar cell 704 can include any suitable shape for opening 123 to provide an offset contact, such as a square shape as is depicted. Referring to part (d) of FIG. 7, a solar cell 706 can include a unified line shape for opening 123 to provide an offset contact. In some examples, the shape and/or form of the emitter region and/or openings can be governed by the process in which these were formed. In example, the openings 123 and have an area that is related to a laser spot size, where the openings 123 can be formed using a laser contact formation process. Also, although particular shapes are shown, it is to be appreciated that the embodiments herein can have any type of shape and are not limited to the particular shapes and/or forms presented above.

Figure 8:
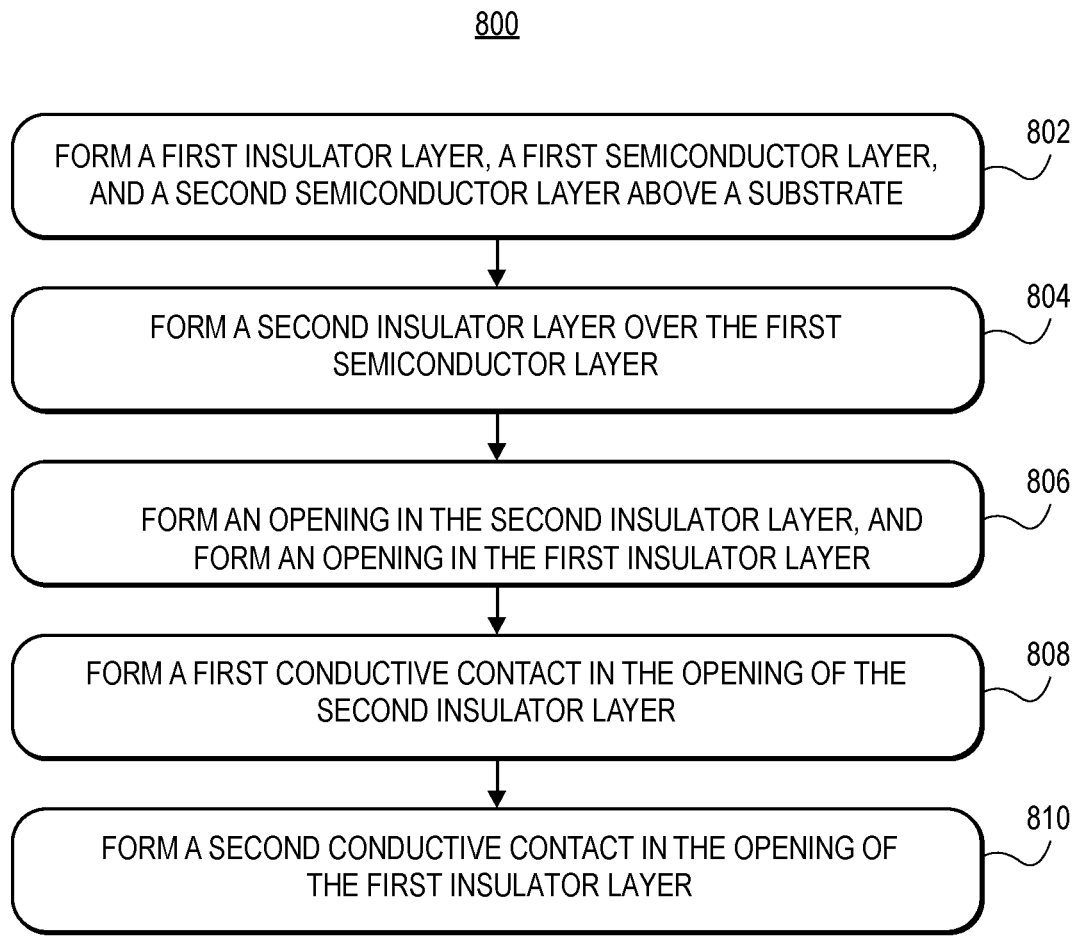
FIG. 8 is a flowchart illustrating a method of fabricating a solar cell, according to some embodiments.

Turning now to FIG. 8, as an exemplary fabrication approach, FIG. 8 is a flowchart 800 illustrating a method of fabricating a solar cell, according to some embodiments.

Referring to operation 802 of flowchart 800 of FIG. 8, a method of fabricating a solar cell includes forming a first insulator layer, a first semiconductor layer, and a second semiconductor layer above a substrate. The first insulator layer can have a first opening, where a first portion of the first semiconductor layer can be in the first opening of the first insulator layer, and a second portion of the first semiconductor layer can be over a portion of the first insulator layer. The second semiconductor layer can be between the first insulator layer and the substrate. The second semiconductor layer can have a conductivity type opposite a conductivity type of the first semiconductor layer.

In an embodiment, the first portion of the first semiconductor layer is continuous with the second portion of the first semiconductor layer. In an embodiment, the first semiconductor layer includes polycrystalline silicon, and the substrate includes monocrystalline silicon. In an embodiment, a first dielectric layer is between the first semiconductor layer and the substrate. A second dielectric layer can be between the second semiconductor layer and the substrate.

In an embodiment, prior to forming the first insulator layer, the first semiconductor layer, and the second semiconductor layer above the substrate, a texturization process can be performed on the front side of the substrate. In an example, a hydroxide-based wet etchant can be used to form a texturized surface on the front side of the substrate. It is to be appreciated, however, that the texturizing of the front side can be omitted from the process flow. In an embodiment, prior to or within the same or a single process operation of the texturization process, the substrate can be cleaned, polished, planarized and/or thinned. In an example, a wet chemical clean process can be performed prior and/or subsequent to the texturization process. Although the texturization process can be performed at the start of the fabrication process, in another embodiment, the texturization process can be performed at another operation in the fabrication process. In an example, the texturization process can instead be performed subsequent to a patterning process. In one example, the texturization process can be performed prior to a thermal process. In one such example, the texturization process can be performed subsequent to a patterning (e.g., patterning of polycrystalline silicon regions) and prior to a thermal process.

In an embodiment, the second dielectric layer can be formed in an oxidation process and is a thin oxide layer such as a tunnel dielectric layer (e.g., silicon oxide). In one embodiment, the second dielectric layer can be formed in a deposition process. In an embodiment, the second dielectric layer is a thin oxide layer or silicon oxynitride layer. In an embodiment, forming the second dielectric layer can include forming the second dielectric layer at a thickness of approximately 2 nanometers or less. In an example, a thermal process or oven can be used to grow the second dielectric layer. As used herein, the second dielectric layer can also be referred to as a second thin dielectric layer.

In an embodiment, forming the second semiconductor layer can include forming a polycrystalline silicon layer. In an embodiment, forming the second semiconductor layer can include forming a silicon layer on the second dielectric layer, forming a first insulator layer over the silicon layer and, subsequently, patterning the silicon layer, first insulator layer and second dielectric layer to form an opening in the first insulator layer and the second semiconductor layer (e.g., to form a polycrystalline silicon layer having an insulator layer thereon, with an opening formed in the polycrystalline silicon layer and the insulator layer). In another example, in contrast to the above, a screen printing, inkjet printing or any other process for directly depositing a patterned silicon layer can used to form the second semiconductor layer.

In an embodiment, the second dielectric layer is formed over a back side of a substrate (e.g., a silicon substrate). In one embodiment the second dielectric layer is a thin oxide layer. In an embodiment, the second semiconductor layer, such as a silicon layer, can be deposited over the second dielectric layer. In one example, a low pressure chemical vapor deposition process can be used to deposit the silicon layer over the second dielectric layer. In an embodiment, the silicon layer is grown on the second dielectric layer in a thermal process and/or an oven. In one embodiment, the second dielectric layer and the silicon layer can be formed (e.g., grown) in the same or in a single oven and/or in the same or single process operation. In some embodiments, the second dielectric layer and the silicon layer can be formed on the back side, the front side and/or side edges of the substrate, where, in a subsequent patterning or cleaning process can be performed to remove the second dielectric layer and the second semiconductor layer from the front side and/or side edges of the substrate.

Forming the second semiconductor layer can include, in an embodiment, forming a silicon layer having a second conductivity type. In an example, forming the silicon layer can include growing a P-type silicon layer over the second dielectric layer (e.g., a thin oxide layer). In other embodiments, the silicon layer can be an N-type silicon layer. In an embodiment, the silicon layer is an amorphous silicon layer. In one such embodiment, the amorphous silicon layer is formed using low pressure chemical vapor deposition (LPCVD) or plasma enhanced chemical vapor deposition (PECVD). In an embodiment, the silicon layer can be a polycrystalline silicon. In an embodiment, the silicon layer is grown on the second dielectric layer in a thermal process and/or an oven. In one embodiment, the second dielectric layer and the silicon layer can be grown in the same or single oven and/or in the same or single process operation.

In another embodiment, the silicon layer can be formed undoped. In one such embodiment, a dopant layer can be formed on the silicon layer and a thermal process can be performed to drive dopants from the dopant layer into the silicon layer resulting in a silicon layer having the second conductivity type (e.g., p-type or n-type). In an embodiment, forming the second semiconductor layer can include forming a first insulator layer on the silicon layer. In an embodiment the first insulator layer can include silicon dioxide. In an example, a blanket deposition process can be performed to form the first insulator layer. In an embodiment, the first insulator layer can be formed to a thickness less than or equal to approximately 1000 Angstroms.

In an embodiment, the first dielectric layer can be formed in an oxidation process and is a thin oxide layer such as a tunnel dielectric layer (e.g., silicon oxide). In one embodiment, the first dielectric layer can be formed in a deposition process. In an embodiment, the first dielectric layer is a thin oxide layer or silicon oxynitride layer. In an embodiment, the first dielectric layer can have a thickness of approximately 2 nanometers or less. In an example, forming the first dielectric layer on portions of the second semiconductor layer and portions of the substrate can include forming the first dielectric layer on exposed portions of the second semiconductor layer and on exposed portions of the substrate. In one example, the exposed regions of the second semiconductor layer and the substrate can be formed after a patterning process performed to pattern the first insulator layer, the second semiconductor layer and the second dielectric layer. As used herein, the first dielectric layer can also be referred to as a first thin dielectric layer.

With respect to forming the first semiconductor layer, in an embodiment, a low pressure chemical vapor deposition process can be used to deposit a silicon layer over the first dielectric layer. In an embodiment, the silicon layer can be a polycrystalline silicon. In an embodiment, the silicon layer is grown on the first dielectric layer in a thermal process and/or an oven. In one embodiment, the first dielectric layer and the silicon layer can be grown in the same or single oven and/or in the same or single process operation. In an embodiment, the silicon layer can be formed undoped. In an embodiment, the silicon layer is an amorphous silicon layer. In one such embodiment, the amorphous silicon layer is formed using low pressure chemical vapor deposition (LPCVD) or plasma enhanced chemical vapor deposition (PECVD).

In another embodiment, forming a first semiconductor layer can include forming a silicon layer having a different conductivity type than the second semiconductor layer. In one such example, forming the silicon layer can include forming a pre-doped silicon layer. In one example, forming the silicon layer can include growing an n-type silicon layer over the first dielectric layer (e.g., a thin oxide layer). In an alternative embodiment, a p-type silicon layer is formed.

Referring to operation 804 of flowchart 800 of FIG. 8, the method of fabricating the solar cell also includes forming a second insulator layer over the first semiconductor layer.

In an embodiment, forming first semiconductor layer over a back side of a substrate includes forming the first semiconductor layer on the first dielectric layer. Forming the first semiconductor layer can include forming a silicon layer on the first dielectric layer, forming a second insulator layer over the silicon layer, patterning the silicon layer, the second insulator layer and first dielectric layer and, possibly, subsequently performing a thermal process to drive dopants from the second insulator layer to the silicon layer to form the first semiconductor layer. For example, in an embodiment, as described herein, the second insulator layer can include a dopant layer, where patterning the silicon layer, the second insulator layer and first dielectric layer can include patterning the first silicon layer, the dopant layer and first dielectric layer. In another example, in contrast to the above, a screen printing, inkjet printing or any other process for directly depositing a patterned silicon layer can used to form the first semiconductor layer.

In an embodiment where the second insulator layer can include a dopant layer, forming the first semiconductor layer can include performing a thermal process to drive dopants from the dopant layer to the silicon layer. In an embodiment, the conductivity type of the dopants is N-type, e.g., the dopants are phosphorous and/or arsenic dopants. In an example, the thermal process can include heating to a temperature approximately greater than or equal to 900 degrees Celsius to drive dopants from dopant layer to the first silicon layer. In some embodiments, patterning the first semiconductor layer can be performed subsequent to performing a thermal process. In some embodiments, e.g., where the silicon layer is pre-doped or formed including an n-type or p-type conductivity type, it can be the case that the thermal process need not be performed.

Referring to operation 806 of flowchart 800 of FIG. 8, the method of fabricating the solar cell also includes forming an opening in the second insulator layer, the opening over the second portion of the first semiconductor layer. A second opening is formed in the first insulator layer.

In an embodiment, the first insulator layer, second semiconductor layer and second dielectric layer can be patterned to form the openings therein. In an embodiment, the first semiconductor layer can have a second insulator layer formed over the second semiconductor layer. In an embodiment, the opening in the second insulator layer can be formed during the patterning used to form the second opening in the first insulator layer. In an embodiment, a lithographic or screen print masking and subsequent etch process can be used to pattern the first and second insulators layer and, possibly, the second semiconductor layer. In another embodiment, a laser ablation process (e.g., direct write) can be used to pattern the first and second insulator layers and, possibly, the second semiconductor layer.

In an embodiment, the contact openings can be formed using a mask and etching process. In an example, a mask can be formed and a subsequent wet chemical etching process can be performed to form the contact openings. In some embodiments, a wet chemical cleaning processes can be performed to remove the mask. In one embodiment, the patterning can include performing a laser patterning process (e.g., laser ablation) to form contact openings in the first insulator layer and the second insulator layer. In one embodiment the patterning process for forming contact openings in the first insulator layer and second insulator layer can be performed in the same or single operation (e.g., using a laser in a same or a single laser processing chamber) or, alternatively, can be performed separately (e.g., separate laser patterning processes can be used to form contact openings in the first insulator layer and second insulator layer). In an embodiment, where the second insulator layer can include a dopant layer, the patterning can include patterning the first insulator layer and the dopant layer to form contact openings through the first insulator layer and dopant layer in a single operation or performed separately.

Referring to operation 808 of flowchart 800 of FIG. 8, the method of fabricating the solar cell also includes forming a first conductive contact in the opening of the second insulator layer, the first conductive contact electrically coupled to the second portion of the first semiconductor layer at a location beneath the opening of the second insulator layer. In one embodiment, the first conductive contact is further on a portion of the second insulator layer over the first insulator layer, and the first conductive contact is further on a portion of the second insulator layer over the first portion of the first semiconductor layer.

Referring to operation 810 of flowchart 800 of FIG. 8, the method of fabricating the solar cell also includes forming a second conductive contact in the second opening of the first insulator layer, the second conductive contact electrically coupled to the second semiconductor layer at a location beneath the second opening of the first insulator layer.

In an embodiment, forming the conductive contact structures can include performing a sputtering process, locally depositing a metal, a blanket deposition process, a plating process, bonding a metal foil and/or bonding wires to first and the second semiconductor layers. In an example, the conductive contact structures can include a locally deposited aluminum, aluminum foil and/or an aluminum wire. In an embodiment, the conductive contact structures can include one or more metals and/or metal alloys. In an example, the conductive contact structures can include aluminum, titanium tungsten and/or copper, among other metals. In an embodiment, the conductive contact structures can include one, two or more layers of metal. In an example, the conductive contact structures can include a metal seed layer. In an embodiment, the metal seed layer can include a first layer including copper, a second layer including tungsten and a third layer including aluminum.

In an embodiment, a thermal compression process can be used to electrically connect the first and second conductive contacts to the first and second semiconductor layers (e.g., the first and second polycrystalline silicon layers). In an example, a thermal compression process can be used to adhere a wire or a plurality of wires to the first and second semiconductor layers. In one embodiment, a metal foil can be bonded (e.g., welded) to the first and second semiconductor layers. In an embodiment, forming the first and second conductive contacts can include performing a blanket deposition process. In an example, forming the first and second conductive contacts can include performing an electroplating process. In some examples, forming the first and second conductive contacts can include performing a blanket deposition process to form a metal seed layer, subsequently plating metals and performing a patterning process to form the first and second conductive contacts. In an example, forming the first and second conductive contacts using a plating process can include placing the substrate in a bath to plate metal to the substrate and form the first and second conductive contacts. In another embodiment, a local metal deposition process can be used to form the first and second conductive contacts in one process operation.

It is to be appreciated that, as used throughout, like reference numbers refer to similar elements throughout the figures. In an embodiment, the description for the first semiconductor layer 112, first conductive contact 129 and/or first insulator layer 112 of FIG. 2 can also be applied or describe the first semiconductor layer 112, first conductive contact 129 and/or first insulator layer 112 of FIG. 1. In an example, like reference numbers between FIGS. 1, 2A, 2B, 3 and 4-7 can refer to similar elements throughout FIGS. 1, 2A, 2B, 3 and 4-7. It is also to be appreciated that, although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein can have application to front contact solar cells as well. Furthermore, it is to be appreciated that, where N+ and P+ type doping is described specifically, other embodiments contemplated include the opposite conductivity type, e.g., P+ and N+ type doping, respectively.

Figure 9:
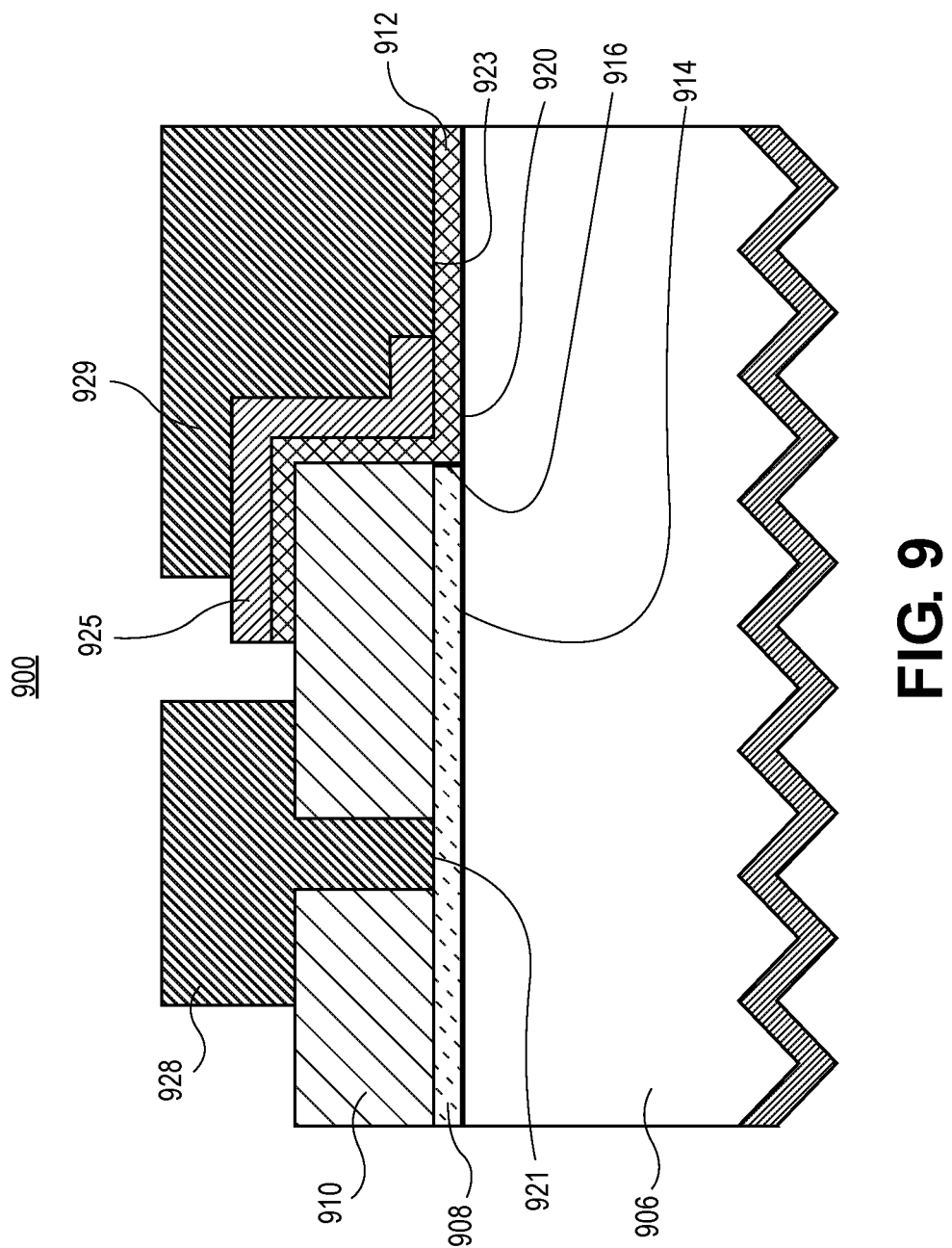
FIG. 9 illustrates a cross-sectional view of a portion of a solar cell for comparative purposes.

Turning now to FIG. 9, FIG. 9 illustrates a cross-sectional view of a portion of a solar cell for comparative purposes. Referring to FIG. 9, a solar cell 900 includes a substrate 906, a first semiconductor layer 912 and a second semiconductor layer 908. A first dielectric layer 920 is between the substrate 906 and the first semiconductor layer 912. A second dielectric layer 914 is between the substrate 906 and the second semiconductor layer 908. A third dielectric layer 916 is between the first semiconductor layer 912 and the second semiconductor layer 908. A first dielectric layer 910 has an opening 921 with a conductive contact 928 therein. A second dielectric layer 925 has an opening 923 with a conductive contact 929 therein. Different from the above described embodiments, conductive contact 929 is formed in opening 923 which is within or inside of a perimeter of an emitter region of the solar cell 900. That is, contact 929 is aligned to the associated emitter structure. The arrangement can be vulnerable to metal spiking and/or laser contact damage (e.g., the latter at a laser ablation process used for contact opening formation where the contact opening is within a perimeter of the emitter region).

By contrast, to solar cell 900, the embodiments described herein can be less vulnerable to metal spiking and/or laser contact damage, particularly in the case where laser scribing overlaps or at least partially overlaps with an underlying emitter region. Advantages of implementing embodiments described herein can include, but need not be limited to or restricted by: (1) resistance to metal spiking, (2) laser contact elimination for one type of emitter structure, (3) enabling the ability to do many different emitter coverage fractions, e.g., very small floating contact coverage with larger emitter perimeter length, and/or (4) applicability for numerous types of metallization, such as plating, wire metallization, or laser assisted metallization processes.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims can be formulated during prosecution of this application (or an application claiming priority thereto) to any such combination of features. In particular, with reference to the appended claims, features from dependent claims can be combined with those of the independent claims and features from respective independent claims can be combined in any appropriate manner and not merely in the specific combinations enumerated in the appended claims.

What is claimed is:

1. A method of fabricating a solar cell, the method comprising:
    forming a first emitter region over a substrate, the first emitter region having a perimeter around a portion of the substrate;
    forming a first conductive contact electrically coupled to the first emitter region only at a location outside of the perimeter of the first emitter region through an opening in a first insulator layer, the first conductive contact having a portion that extends vertically over the first emitter region, wherein a portion of the first emitter region at the location outside of the perimeter of the first emitter region is not in direct physical contact with the substrate; and
    forming a second insulator layer over the substrate, wherein a second portion of the first emitter region is within one or more openings in the second insulator layer and along a top surface of the second insulator layer, and wherein the second portion of the first emitter region is in contact with sidewalls of the one or more openings of the second dielectric layer and is in contact with the top surface of the second insulator layer.

2. The method of claim 1, further comprising:
    forming a first semiconductor layer over the substrate, wherein the first emitter region is in a first portion of the first semiconductor layer, and the location outside of the perimeter of the first emitter region is on a second portion of the first semiconductor layer.

3. The method of claim 2, wherein the first portion of the first semiconductor layer is continuous with the second portion of the first semiconductor layer.

4. The method of claim 2, further comprising:
    forming a second semiconductor layer between the second insulator layer and the substrate, the second semiconductor layer having a conductivity type opposite a conductivity type of the first semiconductor layer, and the second semiconductor layer included in a second emitter region of the solar cell.

5. The method of claim 4, wherein the second insulator layer has another opening, the method further comprising:
   forming a second conductive contact electrically coupled to the second semiconductor layer at a location beneath the other opening of the second insulator layer.

6. The method of claim 2, wherein the first semiconductor layer comprises polycrystalline silicon, and the substrate comprises monocrystalline silicon.

7. The method of claim 6, further comprising:
   forming a dielectric layer between the first semiconductor layer and the substrate.

* * * * *